United States Patent [19]
Rust et al.

[11] Patent Number: 5,574,953
[45] Date of Patent: Nov. 12, 1996

[54] STORING COMPRESSED DATA IN NON-CONTIGUOUS MEMORY

[75] Inventors: Robert Rust; Roger L. Pennington, both of Boise, Id.

[73] Assignee: Hewlett-Packard Company, Palo Alto, Calif.

[21] Appl. No.: 293,229

[22] Filed: Aug. 19, 1994

[51] Int. Cl.$^6$ .............................. G06F 12/02; H03M 7/30
[52] U.S. Cl. .............. 395/888; 395/497.02; 364/DIG. 1; 364/260.4; 364/260.6; 364/254; 364/254.6
[58] Field of Search .................................. 395/600, 877, 395/888, 497.01, 497.02; 341/106; 382/56; 380/42; 364/715.02

[56] References Cited

U.S. PATENT DOCUMENTS

| | | | |
|---|---|---|---|
| 4,849,878 | 7/1989 | Roy ........................................... | 395/600 |
| 5,212,786 | 5/1993 | Sathi ........................................ | 395/600 |
| 5,237,675 | 8/1993 | Hannon, Jr. .............................. | 395/888 |
| 5,247,638 | 9/1993 | O'Brien et al. ........................... | 395/888 |
| 5,278,970 | 1/1994 | Pence ....................................... | 395/888 |
| 5,280,600 | 1/1994 | Van Maren et al. ...................... | 360/48 |
| 5,357,607 | 10/1994 | Sathi et al. ................................ | 395/166 |
| 5,388,093 | 2/1995 | Yoshida et al. ........................... | 369/124 |
| 5,404,511 | 4/1995 | Notarianni ................................ | 395/600 |
| 5,410,671 | 4/1995 | Elgamal et al. ........................... | 395/412 |
| 5,463,772 | 10/1995 | Thompson et al. ....................... | 395/600 |

Primary Examiner—Paul V. Kulik
Attorney, Agent, or Firm—Anthony J. Baca

[57] ABSTRACT

A data compression and decompression method for storing compressed data in non-contiguous memory. As the data is compressed and stored in memory, any non-contiguous segments are properly marked. Such marking requires that the last location contains a pointer to the next memory location used. Just prior to the pointer a special "LINK" code is stored. Thus, when the compressor completes its job, the non-contiguous memory is logically linked together. To decompress the compressed data, a code of the compressed data is retrieved from the non-contiguous memory. If the code is a link code, then an address pointer to the next location in memory where the next compressed data is stored is retrieved from memory. If, in the alternative, the code in not a link code then the code is decompressed.

3 Claims, 4 Drawing Sheets

STORING COMPRESSED DATA IN NON-CONTIGUOUS MEMORY

TECHNICAL FIELD

The present invention relates data compression and more particularly, to an arrangement that allows for the storage of compressed data in non-contiguous memory.

BACKGROUND OF THE INVENTION

Data compression systems are known in the prior art that encode a stream of digital data signals into compressed digital code signals and decode the compressed digital code signals back into the original data. Data compression refers to any process that attempts to convert data in a given format into an alternative format requiring less space than the original. The objective of data compression systems is to effect a savings in the amount of storage required to hold or the amount of time required to transmit a given body of digital information.

To be of practical utility, a general purpose digital data compression system should satisfy certain criteria. The system should have reciprocity. In order for a data compression system to possess the property of reciprocity it must be possible to re-expand or decode the compressed data back into its original form without any alteration or loss of information. The decoded and original data must be identical and indistinguishable with respect to each other. The property of reciprocity is synonymous to that of strict noiselessness used in information theory. Some applications do not require strict adherence to the property of reciprocity. One such application in particular is when dealing with graphical data. Because the human eye is not that sensitive to noise, some alteration or loss of information during the compression de-compression process is acceptable.

The system should provide sufficient performance with respect to the data rates provided by and accepted by the devices with which the data compression and de-compression systems are communicating. The rate at which data can be compressed is determined by the input data processing rate into the compression system, typically in millions of bytes per second (megabytes/sec). Sufficient performance is necessary to maintain the data rates achieved in present day disk, tape and communication systems which rates typically exceed one megabyte/sec. Thus, the data compression and decompression system must have enough data band-widths so as to not adversely affect the overall system. The performance of data compression and de-compression systems is typically limited by the computations necessary to compress and de-compress and the speed of the system components such as, random access memory (RAM), and the like, utilized to store statistical data and guide the compression and de-compression process. Performance for a compression device is characterized by the number of cycles required per input character under the compressor. The fewer the number of cycles, the higher the performance.

Another important criteria in the design of data compression and de-compression systems is compression effectiveness, which is characterized by the compression ratio. The compression ratio is the ratio of data size in uncompressed form divided by the size in compressed form. In order for data to be compressible, the data must contain redundancy. Compression effectiveness is determined by how effectively the compression procedure uses the redundancy in the input data. In typical computer stored data, redundancy occurs both in the nonuniform usage of individual symbology, for example digits, bytes, or characters, and in frequent recurrence of symbol sequences, such as common words, blank record fields and the like.

General purpose data compression procedures are known in the prior art, three relevant procedures being the Huffman method, the Tunstall method and the Lempel-Ziv method. The Huffman method is widely known and used, reference thereto in article of D. A. Huffman entitled "A Method For Construction Of Minimum Redundancy Codes", Proceedings IRE, 40, 10 pages 1098–1100 (September, 1952). Reference to the Tunstall algorithm may be found in Doctoral thesis of B. P. Tunstall entitled "Synthesis of Noiseless Compression Codes", Georgia Institute of Technology (September, 1967). Reference may be had to the Lempel-Ziv procedure in a paper authored by J. Ziv and A. Lempel entitled "A Universal Algorithm For Sequential Data Compression", IEEE Transactions on Information Theory, IT-23, 3, pages 337–343 (May, 1977).

One of the first general purpose data compression procedures developed is the Huffman method. Briefly described, the Huffman procedure maps full length segments of symbols into variable length words. The Huffman data compression procedure suffers from two limitations. Firstly, the Huffman procedure operates under the constraint that the input data to be compressed be parsed into fixed length segments of symbols. Although the Huffman procedure provides the best compression ratio that can be obtained under these constraints, when the constraint is relaxed it is possible to obtain significantly better compression ratios by utilizing other procedures. Secondly, Huffman coding requires full knowledge of the statistical characteristic of the source data. The Huffman procedure operates under the assumption that the probability with which each fixed length input segment occurs is known. This requirement of the Huffman procedure can in practice, be satisfied by the use of an adaptive version of the procedure which accumulates the necessary statistics during processing of the data. This, however, is cumbersome, and requires considerable working memory space and performs sub-optimally during adaptation.

The Tunstall algorithm, which maps variable length segments of symbols into fixed length binary words, is complementary to the Huffman procedure with the fixed length constraints now applied to the output segments instead of the input segments. Like the Huffman procedure, the Tunstall procedure requires a foreknowledge of the source data probabilities. Again this foreknowledge requirement can be satisfied to some degree by utilizing an adaptive version that accumulates the statistics during processing of the data.

The Lempel-Ziv procedure maps variable length segments of the symbols into variable length binary words. It is asymptotically optimal when there are no constraints on the input or output segments. In this procedure the input data string is parsed into adaptively grown segments, each segment consisting of an exact copy of an earlier portion of the input string suffixed by one new symbol from the input data. The copy which is to be made is the longest possible and is not constrained to coincide with any earlier parsed segment. The code word which replaces the segment in the output contains information consisting of a pointer to where there earlier copied portion begins, the length of the copy, and the new symbol.

To help keep cost reasonably, data compression is used in the art of page printers such as electrophotography. For example, a 600 dot per inch (DPI) page is about 4 MB in size. By using a compression technique, this can be reduced to about 1 MB. The art of electrophotography printing places a performance constraint for the decompression process. In particular, the compressed data must be decompressed fast enough to provide a constant stream of data to the print engine. To insure that this performance requirement is met, the decompression task is performed by hardware.

Hardware data decompression is typically simplified by first, using a fixed code size and second, reserving special codes that aid the decompressor. By using a fixed code size, the decompressor will accept a fixed code size and produce a fixed code. Thus, for example, a typical hardware decompressor will accept a compressed 8-bit byte and output one or more 8-bit decompressed bytes. Because the input is fixed, special codes are necessary to direct the decompressor. One such arrangement reserves a LITERAL code to indicate that the next code is a literal that is, it is not compressed. Additional, an END_OF_DATA code is defined such that the hardware decompressor stops when it detects the EOD Code.

Because the hardware decompressor simply walks through memory until it detects an EOD code, prior to the present invention, the compressed data must reside in contiguous memory. However, it may not always be possible to find 1 MB of contiguous memory because memory tends to become fragmented over time.

SUMMARY OF THE INVENTION

In order to accomplish the present invention, there is provided a data compression and decompression method for storing the compressed data in non-contiguous memory. Several embodiments are possible to create the compressed the data. However, basically as the data is compressed and stored in memory, any non-contiguous segments must be properly marked. Such marking requires that the last location contains a pointer to the next memory location used. Just prior to the pointer the special "LINK" code is stored. Thus, when the compressor completes its job, the non-contiguous memory is logically linked together.

This linking process can be accomplished "on the fly" as just described or, all the linking may be performed prior to starting the compression process. With this approach, a memory management unit or the like appropriates the necessary memory. Next, at each discontinuity the appropriate "LINK" code and pointer are stored. Once the memory has been linked, the compressor follows the links as it stores the compressed data.

To decompress the compressed data, first a code of the compressed data is retrieved from the non-contiguous memory. If the code is a link code, then an address pointer to the next location in memory where the next compressed data is stored is retrieved from memory. If, in the alternative, the code in not a link code then the code is decompressed.

BRIEF DESCRIPTION OF THE DRAWINGS

A better understanding of the invention may be had from the consideration of the following detailed description of the preferred embodiment taken in conjunction with the accompanying drawings in which.

DETAILED DESCRIPTION OF THE PREFERRED EMBODIMENTS

Figure 1:
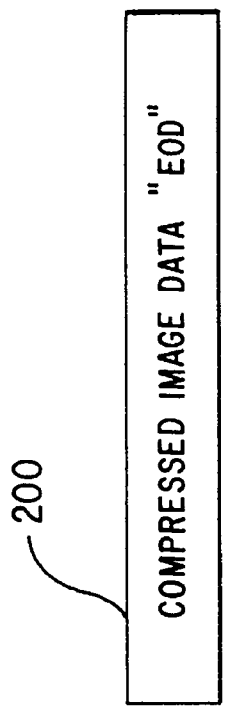
FIG. 1 attempts to visualize how a compressed image data would look stored in contiguous memory.

Referring first to FIG. 1. As stated before, generally, a compressed image must be stored in contiguous memory. Visualizing this requirement might look like FIG. 1 showing that the compressed image data must reside in a single memory block 200. The special code "EOD" indicates to the decompressor the end of the compressed data.

Figure 2:
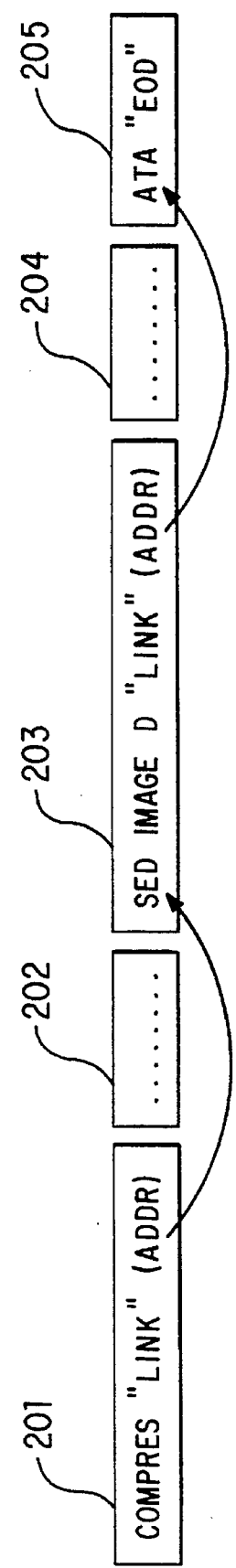
FIG. 2 visualizes how a compressed image data would look stored in non-contiguous memory using the present invention.

Storing the compressed image data in contiguous memory will produce the most compact compressed data. However, fragmentation of memory may preclude finding a contiguous block of memory sufficient in size to store the entire compressed image data. By adding the special code "LINK", the compressed image data can be fragmented to fit the memory fragments. Thus, when the decompressor encounters the LINK code, it knows that a physical address will follow. The physical address indicates where the next memory block starts. FIG. 2 shows how a compression scheme using the present invention allows the compressed data to be fragmented across memory.

Referring to FIG. 2, the decompressor receives the starting address of memory block 201. After decompressing block 201, a "LINK" code is encountered. The ADDR after the LINK code points the decompressor to the beginning of block 203 effectively skipping block 202. Block 204 is skipped in a similar manner. Finally, when the decompressor reaches the end of block 205, an "EOD" code in encountered signaling the decompressor to stop.

The compressor creates the fragmented data of FIG. 2. Using the example of FIGS. 1 and 2, the compressor first determines the number of fragments and the size of each of available memory. Unless the compressor has foreknowledge about the incoming uncompressed data, the exact amount of storage necessary to store the compressed data is not known. Thus, the compressor makes a guess based on heuristical or statistical data or it can assume a worst case. By allowing storage of the compressed data in non-contiguous memory, the compressor's original guess about the necessary storage requirements is less critical.

Figure 5:
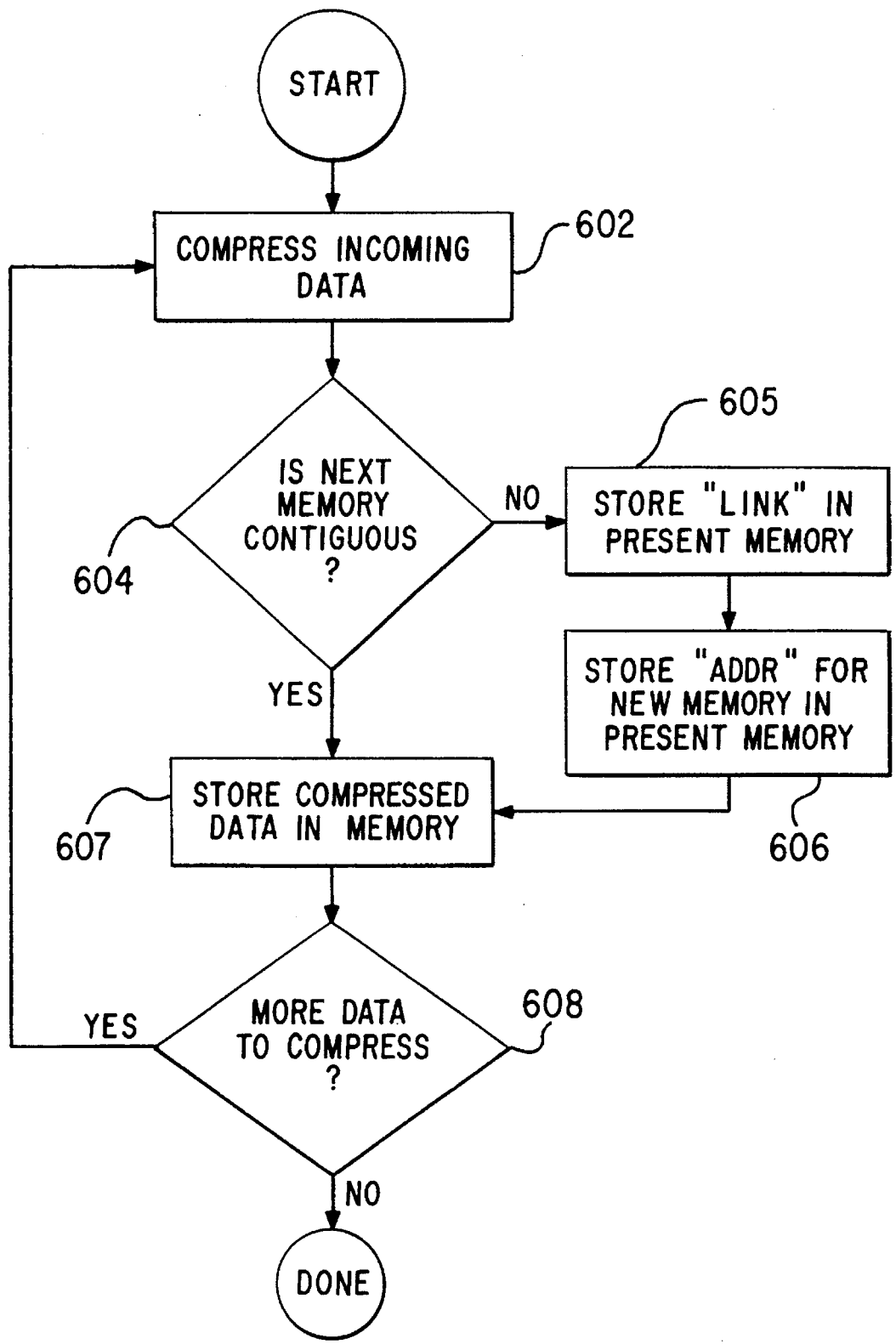
FIG. 5 is a flowchart showing a preferred embodiment data compression in accordance with the present invention.

Conceptually, the compressor performs two tasks. First it actually compresses the incoming data. Second, it links the compressed data if it is not stored in contiguous memory. A flowchart showing one possible embodiment of the compressor is shown in FIG. 5. In FIG. 5; the compressor compresses the incoming data 602. Next, it determines if the memory is contiguous 604. If the memory is contiguous, then the compressed data is simply stored 607. If, however, the memory is not contiguous, then the compressor inserts the "LINK" code 605 and the appropriate address 606 as shown in FIG. 2. The process continues 608 until all the incoming data has been compressed.

Under one embodiment, the compressor, based on its guess, requests enough memory to store the compressed data. Assuming that enough memory is available, the memory management unit (MMU) grants the request. As part of the grant, the memory management unit informs the compressor the exact memory structure. Using the memory structure from the memory management unit, the compressor then steps through memory as it compresses the data. Upon completion, the compressor then sends back to the MMU the last memory addressed used. Finally, the MMU deallocates the unused memory.

Under an alternative embodiment, the compressor first asks for a small block of memory. Additional requests are issued as needed. When the compressor receives a new block, it first checks to see if it is contiguous with the last block. If the new block is not contiguous, then the appropriate "LINK" and jump address is added to the end of the previous block. One skilled in the art of logic, will understand that given the above description of the memory structure, several alternative embodiments of the compressor are possible.

Figure 3:
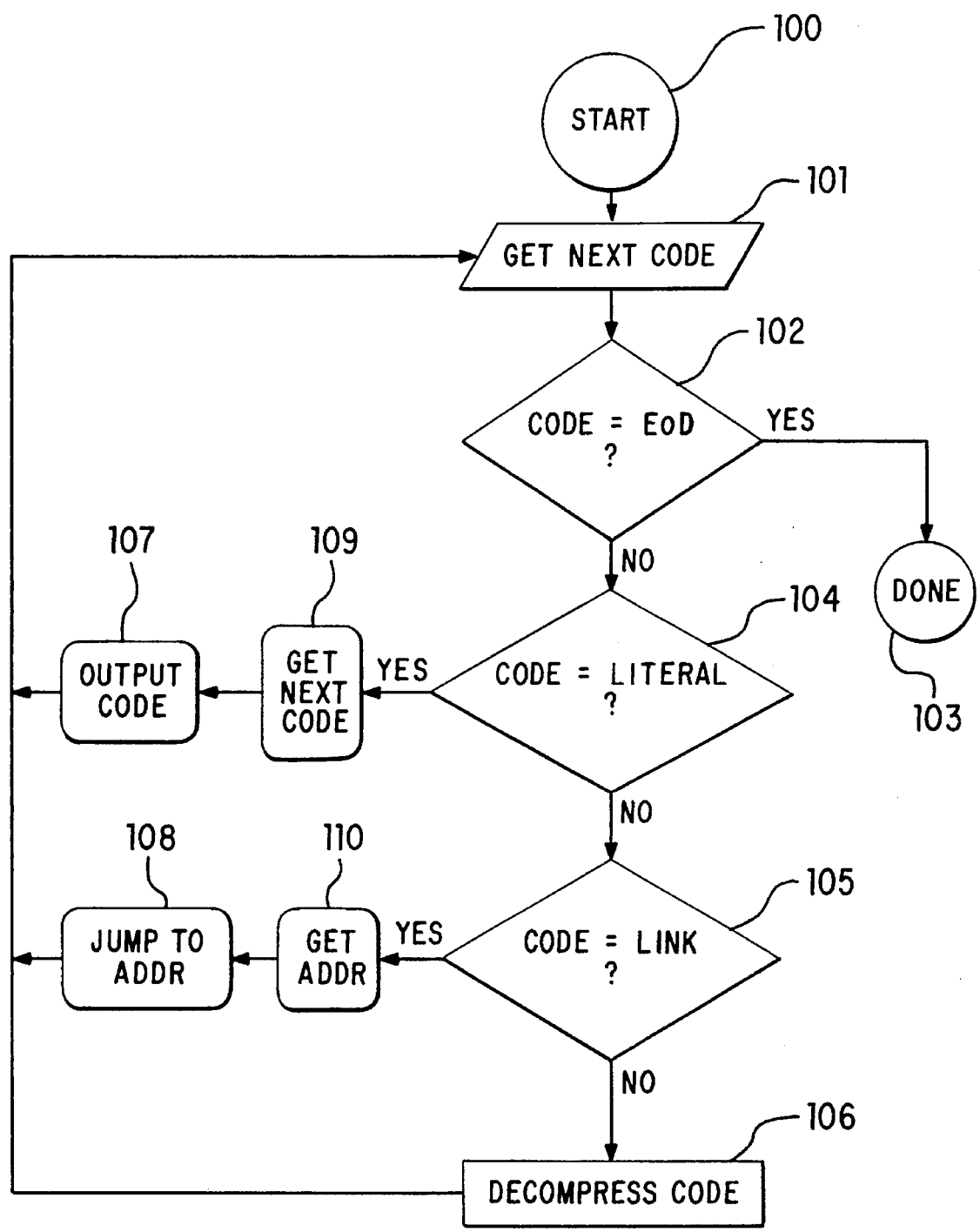
FIG. 3 is a flowchart showing a preferred embodiment for data decompression in accordance with the present invention.

Turning now to the de-compression requirements. A simplified flow chart as shown in FIG. 3 may aid the reader in better understanding the de-compressor part of the present invention. The de-compressor (1408 of FIG. 4) first retrieves the next code from memory 101 (1404 of FIG. 4). Next, the code is analyzed to determine what type the code is. If the code is the special code of END 102, then the de-compressor is done 103. Next, the code is compared to the special code "LITERAL" 104. As state above, the "LITERAL" code signals to the decompressor that the 109 is un-compressed and it should simply be output to the decompressed data stream 107. Next, the code is checked against the special code "LINK" 105. If the code is "LINK" then the next location 110 contains a pointer to where the remaining code resides in memory. Thus, the de-compressor retrieves the next code and then uses it as a pointer to continue de-compressing 108. Finally, if the code is not a special code, then it is simply decompressed 106. One skilled in the art of logic, will understand the decision blocks 102, 104 and 105 can occur in any order. The order as shown in FIG. 3 is only meant to show one possible arrangement.

Figure 4:
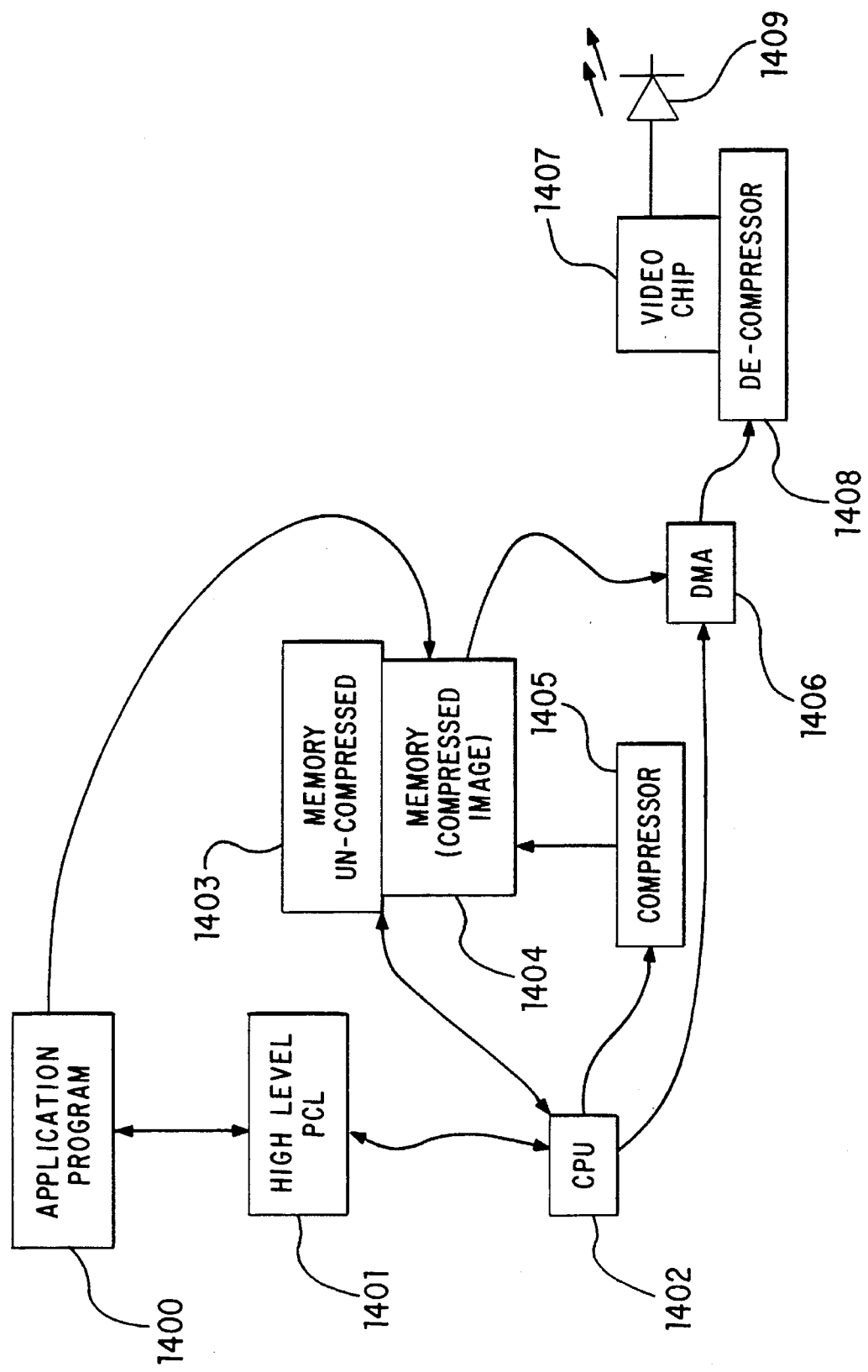
FIG. 4 is a high level functional diagram of a printer system that uses the present invention.

Referring to FIG. 4 where a generic block diagram of a printer is shown. Note that APPLICATION PROGRAM 1400 shown in FIG. 4 is not part of the printer system.

While the data compression method can be used several ways with the block diagram of FIG. 4, two primary ways will be discussed here. Selection of a particular method is primarily determined by projected cost of the overall printer system. With a more expensive implementation, CPU 1402 has sufficient processing power and memory to accomplish the compression algorithm itself. With a low cost printer system, CPU 1402 may not be present and memory requirements are kept to a minimum. With the inexpensive arrangement the application program 1400 must implement the compression algorithm.

With the high performance printer system, application program 1400 sends data to the printer system using a high level printer control language 1401. CPU 1402 retrieves the data from the high level printer control language 1401 and rasterizes that data in an uncompressed format into memory 1403. Next, the CPU retrieves the uncompressed rasterized information from 1403, passes it through compressor 1405, which then stores the compressed image back into memory 1404. At the appropriate time DMA 1406 under control of CPU 1402 retrieves the compressed image from memory 1404. The compressed image is then transferred to decompressor 1408, which performs the decompression algorithm. The output of decompressor 1408 is fed to video chip 1407 which modulates laser 1409 in accordance with the uncompressed image information.

Under the first arrangement, additional throughput between application program 1400 and the printer system can be accomplished by allowing the application program 1400 to compress the rasterized data prior to sending it to the printer system. Using the data compression method the application program can compress the information and then place it in the proper page description language prior to transmitting it to the high level PCL block 1401. When CPU 1402 retrieves the page description language instruction it will decode the instruction to mean that the following information is compressed data. Thus, CPU 1402 bypasses this step of compression and directly places the compressed data into compressed image memory 1404. As before DMA 1406 again retrieves the compressed image from 1404 transmitting it to decompressor 1408 which decompresses it and passes it onto video chip 1407 and laser diode 1409.

The second arrangement is an effort to minimize the cost of the printer system itself. Such an arrangement uses only blocks 1404, DMA 1406, decompressor 1408, video chip 1407 and laser diode 1409. Because the printer system does not contain a CPU, application program 1400 must implement the compression half of the algorithm.

In the normal printing process, DMA 1406 retrieves the compressed image from memory 1404 and, as before, feeds it to decompressor 1408 which decompresses the compressed image. This arrangement may significantly reduce the cost of the printer system since CPU 1402 is no longer necessary. However, such an arrangement does place an additional burden on application program 1400 to rasterize and compress the image.

Although the preferred embodiment of the invention has been illustrated, and that form described, it is readily apparent to those skilled in the art that various modifications may be made therein without departing from the spirit of the invention or from the scope of the appended claims.

What is claimed is:

1. A data decompression method for decompressing a compressed data into an original data where said compressed data is stored in a non-contiguous memory, said method comprising the steps of:

retrieving a code of said compressed data from said non-contiguous memory;

determining if said code is a link code; and if said code is said link code, then reading a pointer where said pointer points to a next area of said non-contiguous, said pointer being stored in memory after said link code.

2. In a computer, method for decompressing a plurality of compressed data in to an plurality of original data where said compressed data is stored in a first memory and said original data is stored in a second memory, said method being performed by said computer, said method comprising the steps of:

said computer reading one of said plurality of compressed data from said first memory;

if said one of said plurality of compressed data is a link code then retrieving an address pointer from said first memory where said address pointer being stored in memory after link code, said address pointer points to a new location in said first memory where a next one of said plurality of compressed data is stored; and if said one of said plurality of compressed data is other than said link code then said computer decompresses said one of said plurality of compressed data into a subset of said plurality of original data and stores said subset of said plurality of original data in said second memory.

3. A data compression method for compressing an uncompressed data into a compressed data where said compressed data is stored in a memory, said method comprising the steps of:

retrieving a sub-set of said uncompressed data;

compressing said sub-set of said uncompressed data into a sub-set of said compressed data; and requesting a next memory segment from said memory, if a present memory segment and said next memory segment are contiguous, storing said sub-set of compressed data in said next memory segment, in the alternative where said next memory segment and said present memory segment are non-contiguous then placing in said present memory segment a link code followed by a pointer pointing to where in said memory said next memory segment is located then saving said compressed data in said next memory.

* * * * *